United States Patent
Zhou et al.

(10) Patent No.: US 11,196,593 B1
(45) Date of Patent: Dec. 7, 2021

(54) FEEDBACK CIRCUIT FOR A DECISION FEEDBACK EQUALIZER

(71) Applicant: Hewlett Packard Enterprise Development LP, Houston, TX (US)

(72) Inventors: Dacheng Zhou, Fort Collins, CO (US); Daniel Alan Berkram, Loveland, CO (US); Ryan Barnhill, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/943,834

(22) Filed: Jul. 30, 2020

(51) Int. Cl.
| H04L 25/03 | (2006.01) |
| H03K 5/24 | (2006.01) |
| G06F 1/06 | (2006.01) |
| H04L 27/04 | (2006.01) |
| H03K 19/20 | (2006.01) |

(52) U.S. Cl.
CPC .......... *H04L 25/03057* (2013.01); *G06F 1/06* (2013.01); *H03K 5/24* (2013.01); *H03K 19/20* (2013.01); *H04L 27/04* (2013.01)

(58) Field of Classification Search
CPC .. H04B 7/0404; H04B 7/0413; H04B 7/0417; H04B 7/088; H04B 7/0695; H04B 7/063; H04L 5/0053; H04L 5/0023; H04L 25/03057; H04L 27/04; H04W 16/28; H03K 19/20; H03K 5/24; G06F 1/06
See application file for complete search history.

(56) References Cited

U.S. PATENT DOCUMENTS

| 7,542,508 | B2 * | 6/2009 | Marlett | H04L 25/03057 375/233 |
| 9,900,121 | B1 * | 2/2018 | Takatori | H04L 25/03057 |
| 10,097,383 | B1 * | 10/2018 | Bulzacchelli | H04L 25/03057 |
| 10,644,911 | B1 * | 5/2020 | Chen | H04L 25/4917 |
| 2009/0252215 | A1 * | 10/2009 | Bulzacchelli | H04L 25/03019 375/233 |
| 2014/0281845 | A1 * | 9/2014 | Cyrusian | G06F 11/08 714/819 |
| 2015/0019770 | A1 * | 1/2015 | Chen | H04L 25/03057 710/104 |
| 2021/0135907 | A1 * | 5/2021 | Zhang | H04L 25/03057 |

* cited by examiner

*Primary Examiner* — Kenneth T Lam
(74) *Attorney, Agent, or Firm* — Park, Vaughan, Fleming & Dowler LLP

(57) ABSTRACT

One embodiment can provide a sampler for a decision feedback equalizer (DFE). The sampler can include a comparator comprising a resolver and a plurality of amplifiers coupled to the resolver. The plurality of amplifiers are to receive an input signal and one or more feedback signals, and the plurality of amplifiers are coupled to each other in parallel, thereby facilitating a summation of the input signal and the one or more feedback signals. The comparator is to generate an output based on the summation of the input signals and the one or more feedback signals. The sampler can further include an inverter to invert the output of the comparator. The inverted output of the inverter is sent to a tap-1 amplifier to generate a tap-1 feedback signal to be sent to the comparator at a next unit interval (UI).

20 Claims, 10 Drawing Sheets

FEEDBACK CIRCUIT FOR A DECISION FEEDBACK EQUALIZER

BACKGROUND

Field

This disclosure is generally related to a decision feedback equalizer (DFE). More specifically, this disclosure is related to the feedback circuit for the DFE.

Related Art

Digital communication systems often rely on equalizers to reduce intersymbol interference (ISI) in order to recover transmitted symbols. For high-speed digital communication systems that use a non-return-to-zero (NRZ) encoding scheme (e.g., four-level pulse-amplitude modulation (PAM4), non-linear equalization schemes are often desirable. Decision feedback equalizers (DFEs) have been shown to be a powerful tool in removing ISI. However, for high data rate (e.g., 56 Gbps or 28 G symbol/s if PAM4 is used) signals, implementing DFE can be challenging. For example, at such a high data rate, the timing for the tap-1 feedback is roughly 36 ps, and the tight timing requirement can present a challenge to circuit designers.

BRIEF DESCRIPTION OF THE FIGURES

In the figures, like reference numerals refer to the same figure elements.

DETAILED DESCRIPTION

Figure 1:
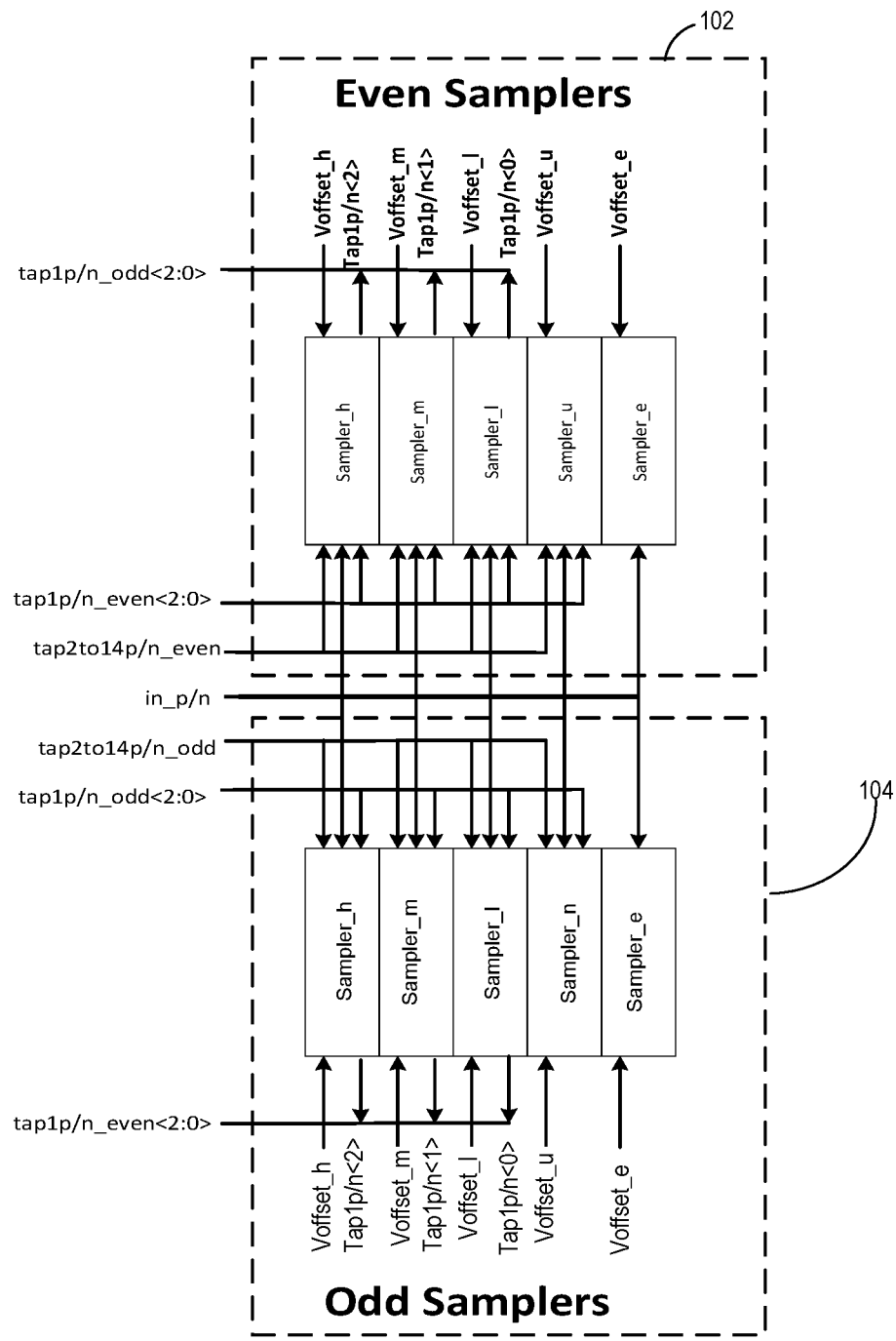
FIG. 1 illustrates a partial view of the half-rate, direct feedback DFE, according to one embodiment.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the scope of the present disclosure is not limited to the embodiments shown, but is to be accorded the widest scope consistent with the principles and features disclosed herein.

The embodiments described herein can provide an analog circuit that can be used for providing tap-1 direct feedback to a DFE. The DFE can be used in a digital communication link implementing PAM4 encoding and operating at a data rate of 56 Gb/s or higher. More specifically, the DFE sampler can include a comparator circuit implementing a pulsed comparator and a summing circuit implementing a tri-state inverter. The tap-1 direct feedback path can include pre-charged amplifiers to enhance operating speed. Compared with traditional approaches, the number of field-effect transistors (FETs) and the amount of time delay can be reduced.

A decision-feedback equalizer (DFE) is a nonlinear equalizer that uses previous data decisions to eliminate the ISI on pulses that are currently being demodulated. More specifically, prior data decisions are multiplied by tap weights and subtracted from the received signal, eliminating post-cursor ISI. A typical DFE can include a decision circuit (or sampler) for making a symbol decision and a feedback circuit (which can include a finite impulse response (FIR) filter and a summing circuit).

DFE operations, which include data slicing, multiplication, and subtraction, must be completed within one unit interval (UI). At high data rate, the UI can be extremely short, making it difficult to close timing on the DFE loop, especially on the first tap or tap-1. A conventional solution is to unroll the loop of the first DFE tap and pre-compute two possibilities for two-level signals. This technique relaxes DFE timing requirements at the cost of doubling the number of samplers. The use of loop unrolling is often limited to tap-1 or the first few taps as the number of slicers and summers increases exponentially with the number of taps. For PAM4 signaling, four parallel sampler paths will be needed in each of the three signal levels, which makes signal loading extremely high. The loop unrolling scheme also requires an additional four-to-one multiplexer inserted into the data path, thus increasing delay further.

To meet the tight timing requirement for high-speed PAM4 links without implementing a large number of samplers, the disclosed embodiments can use a direct feedback and half-rate approach, where the DFE taps are generated using clocked delay stages and their outputs weighted and subtracted from the input signals, and where the taps (e.g., 14 taps in total) can be divided into odd and even groups operating at half the symbol rate. Note that, even at the half rate, the timing requirement for the first tap can remain the same. For example, for the 56 Gbps PAM4 link, the symbol rate is 28 G/s, meaning that, at half the rate, the UI is about 36 ps. Hence, special care is needed for tap-1 to meet this timing requirement.

FIG. 1 illustrates a partial view of the half-rate, direct feedback DFE, according to one embodiment. A DFE 100 can include two groups of samplers, an even sampler group 102 and an odd sampler group 104. The even samplers in even sampler group 102 sample the even bits in incoming data and the odd samplers in odd sampler group 104 sample the odd bits in incoming data. Outputs of even samplers in even sampler group 102 are sent to the odd samplers in odd sampler group 104. Similarly, outputs of odd samplers in odd sampler group 104 are sent to the even samplers in even sampler group 102. For simplicity of illustration, the time delay stages for taps 2-14 are shown in FIG. 1.

Note that each sampler group includes multiple (e.g., five) samplers, with each sampler configured to use different threshold values or timing triggers. For example, sampler_h, sampler_m, and sampler_l are used to sample the openings of the higher, middle, and lower eyes of the PAM4 signal, respectively. The output of these samplers can provide the detected symbol. On the other hand, sampler_e and sampler_u are used for error sampling, including both amplitude and timing errors.

Figure 2A:
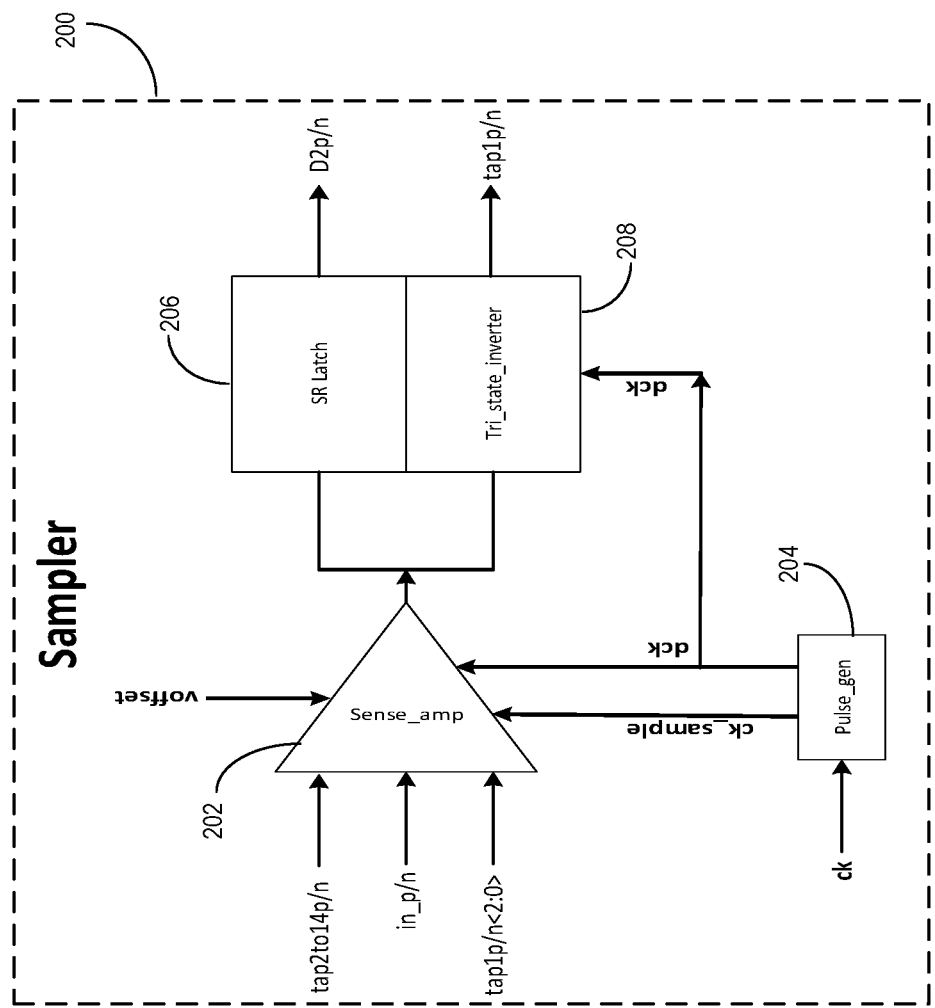
FIG. 2A illustrates an exemplary structure of a sampler, according to one embodiment.

FIG. 2A illustrates an exemplary structure of a sampler, according to one embodiment. Sampler 200 can include a comparator circuit 202, a pulse generator 204, a latch 206, and a tri-state inverter 208.

Comparator circuit 202 can include a sense amplifier, which has a fast response speed. Moreover, comparator circuit 202 can also include a summing function, which can add the DFE feedback (including taps 1 to 14) signals to the input signal. Pulse generator 204 can be configured to generate two clock signals, ck_sample and dck, which can be used as clock signals for the pulsed comparator operation. More particularly, the two clock signals can generate a narrow sampling window, with which the input signal (in_p/n for differential inputs) and the reference signal (voffset) are compared. The dck clock signal can also be sent to and used as clock signals by latch 206 and tri-state inverter 208. Latch 206 can include a set-reset latch, and can be used to store the detected symbols (e.g., for one unit interval). Tri-state inverter 208 can invert the output of comparator circuit 202. The inverted signals are sent to comparator circuit 202 for summation.

Figure 2B:
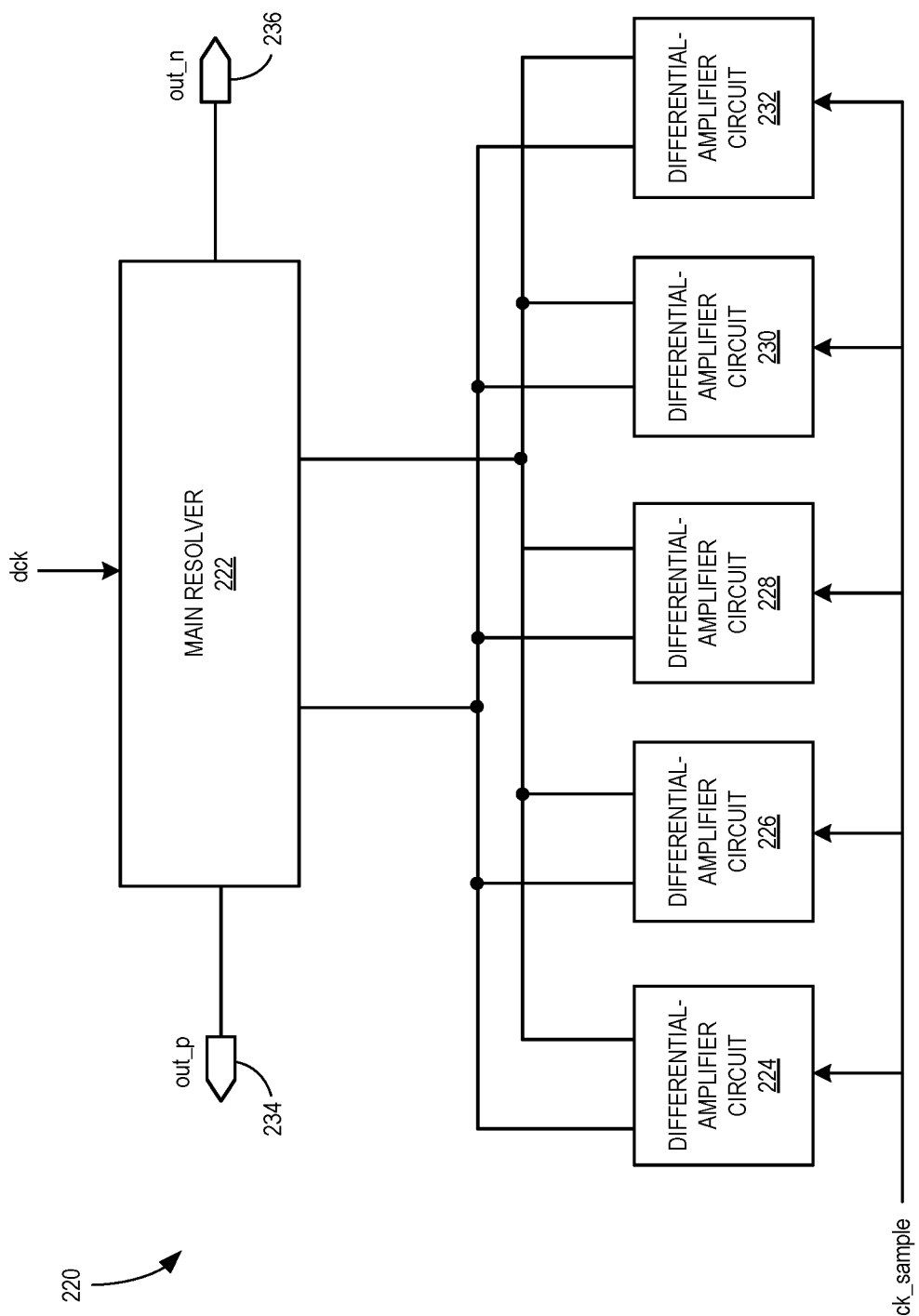
FIG. 2B illustrates a simplified block diagram of an exemplary comparator circuit, according to one embodiment.

FIG. 2B illustrates a simplified block diagram of an exemplary comparator circuit, according to one embodiment. In FIG. 2B, comparator circuit 220 can include a main resolver 222 and a number of differential-amplifier circuits (e.g., circuits 224-232) coupled to main resolver 222.

Main resolver 222 can output a decision via a differential pair that includes a positive output (out_p) 234 and a negative output (out_n) 236. The differential output of main resolver 222 (e.g., out_p and out_n) can be determined based on the various differential-amplifier circuits. More specifically, each differential-amplifier circuit can generate a differential output (out_p and out_n), in the form of a current, based on its own differential input, and the output of the differential-amplifier circuit is coupled to main resolver 222. The outputs of these differential-amplifier circuits will influence the decision output of main resolver 222.

FIG. 2B also shows that main resolver 222 and the differential-amplifier circuits are controlled by two different clock signals generated by the pulse generator 204 shown in FIG. 2A. Main resolver 222 can be controlled by a resolver clock signal denoted dck, and each of the differential-amplifier circuits can be controlled by a sampling clock signal denoted ck_sample.

Figure 3A:
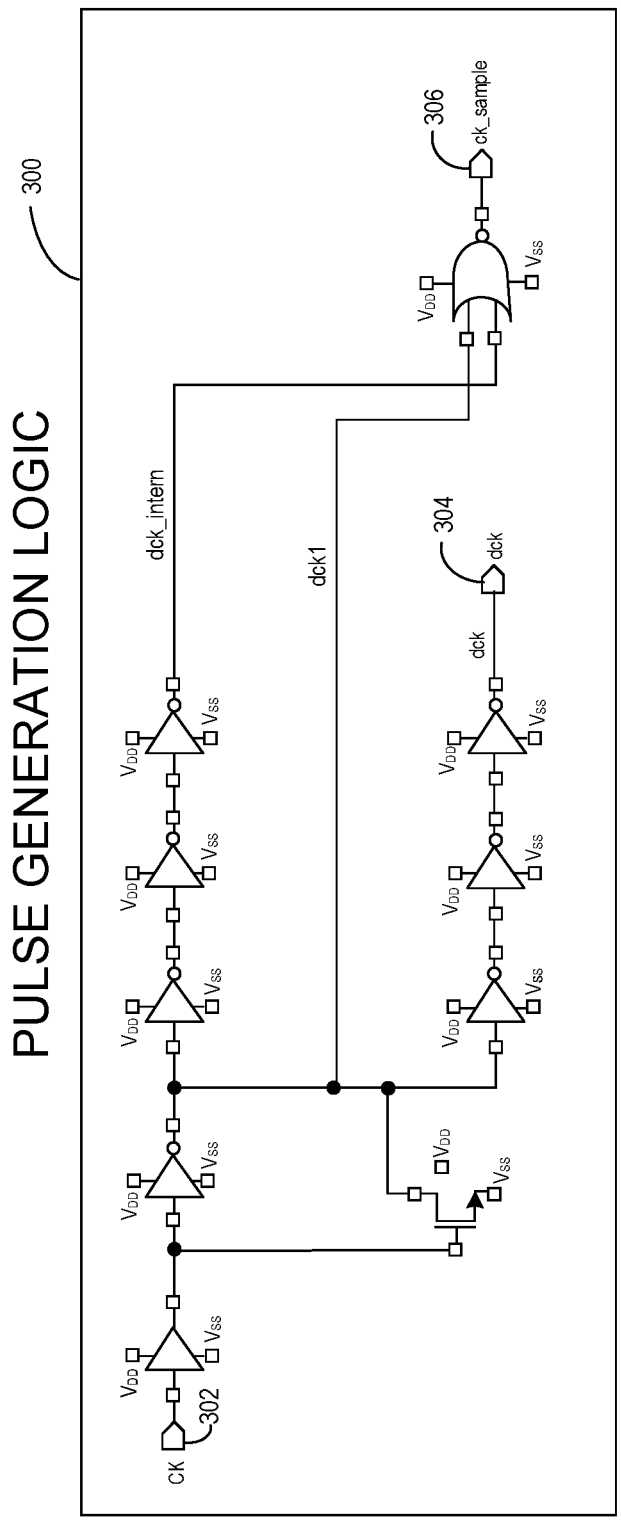
FIG. 3A illustrates an exemplary pulse generator circuit, according to one embodiment.

FIG. 3A illustrates an exemplary pulse generator circuit, according to one embodiment. Pulse generator circuit 300 can include a number of inverters and a base clock input signal 302 (e.g., CK). By inverting the base clock signal and by applying a certain offset, pulse generator circuit 300 can generate two clock outputs, dck 304 and ck_sample 306. As discussed previously, these two clock signals are sent to the sampler to create a small sampling window.

Figure 3B:
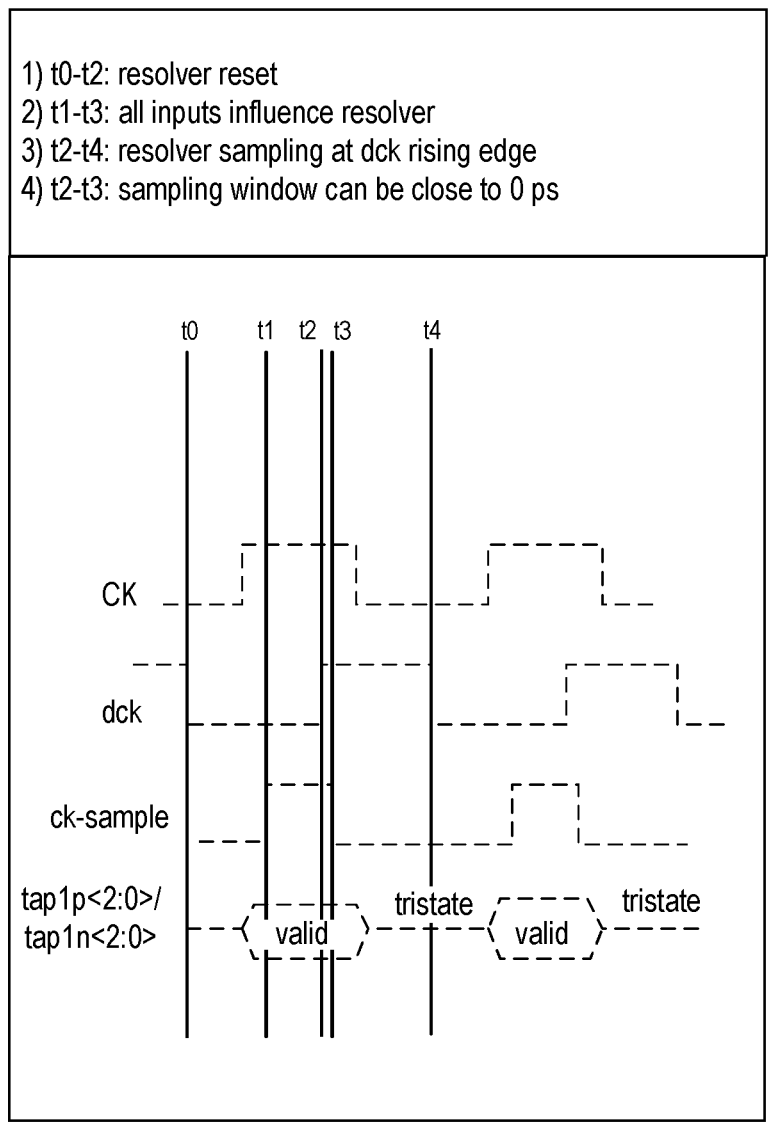
FIG. 3B illustrates exemplary clock signals generated by the pulse generator, according to one embodiment.

FIG. 3B illustrates exemplary clock signals generated by the pulse generator, according to one embodiment. The top clock signal is the base clock (e.g., CK), which can be running at the half rate of the symbol rate. For a 56 Gbps PAM4 link, the base clock can run at a rate of 14 GHz. The dck and ck_sample clock signals are generated based on the base clock and have the same rate but with different offsets. The rising edge of the dck clock and the falling edge of the ck_sample clock form a narrow sampling window, within which a resolver within the sampler samples its input signal. Note that FIG. 3B also shows that a sampling window occurs during the interval when the tap-1 feedback remains valid. The narrow sampling window can ensure that the fluctuation of the input signals to the main resolver does not affect the sampling outcome.

Figure 4A:
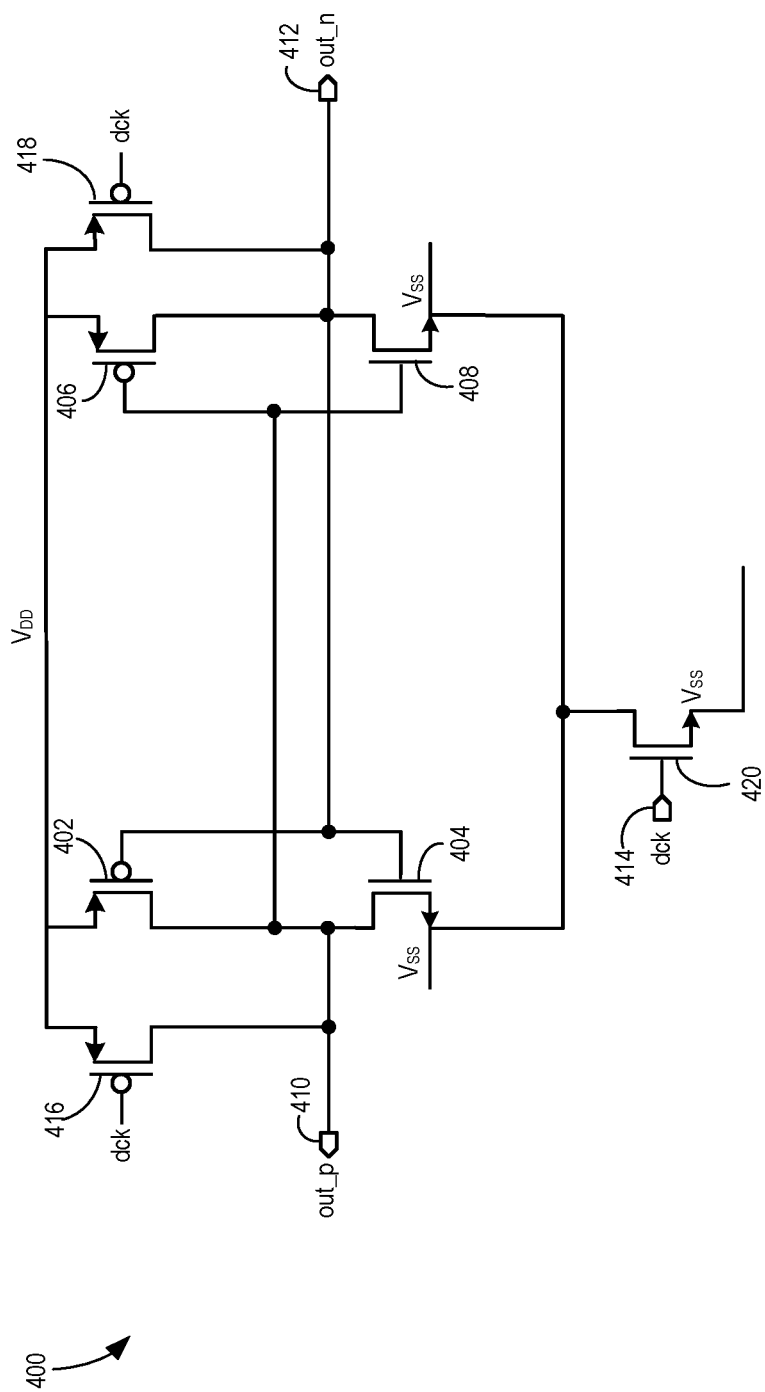
FIG. 4A illustrates a main resolver within the comparator circuit, according to one embodiment.

FIG. 4A illustrates a main resolver within the comparator circuit, according to one embodiment. In the example shown in FIG. 4A, main resolver 400 can include a cross-coupled inverter formed by transistors 402, 404, 406, and 408. Main resolver 400 can output a differential signal via positive side output (out_p) 410 and negative side output (out_n) 412. More specifically, the inverter that provides a positive side output 410 can include a p-channel field effect transistor (P-FET) with inverted gate 402 and an n-channel FET (N-FET) 404. The inverter that provides the negative side output 412 can include a P-FET with inverted gate 406 and an N-FET 408.

Resolver 400 can be controlled by a resolver clock signal (i.e., dck) 414. As shown in FIGS. 3A-3B, the resolver clock signal can be generated from a base clock signal, and resolver 400 can include a reset phase when the resolver clock signal is low. In FIG. 4A, resolver 400 can further include transistors (e.g., P-FETs) 416 and 418, each gated by the resolver clock signal (dck). Transistor 416 is coupled in parallel with transistor 402 and is coupled to positive side output 410. Transistor 418 is coupled in parallel with transistor 406 and is coupled to negative side output 412. One can see that, when the clock signal dck is low, transistors 416 and 418 are turned on, resetting the output of resolver 400. Resolver 400 can further include a transistor 420 coupled in series with transistors 404 and 408. FIG. 4A also shows the positive power supply ($V_{DD}$) and negative power supply ($V_{SS}$) configured to provide bias voltages to the transistors. In some embodiments, outputs (e.g., out_p and out_n) of resolver 400 can be pre-charged (i.e., they are pulled to a high voltage level, such as $V_{DD}$, before resolver 400 is turned on). Pre-charging the outputs of resolver 400 can increase the speed of resolver 400.

Resolver 400 can be coupled to a number of differential-amplifier circuits, in a way similar to what is shown in FIG. 2B. The differential-amplifier circuits can include a main-input circuit, an offset-voltage-input circuit, a calibration-voltage-input circuit, a tap-1 feedback circuit, and a summation pre-buffer circuit for taps 2 to 14. The differential outputs (which can be in the form of currents) of the various differential-amplifier circuits can be coupled to the differential outputs of resolver 400, including positive side output 410 and negative side output 412. Accordingly, the output currents of these differential-amplifier circuits are summed in a parallel fashion, influencing the output voltages of positive side output 410 and negative side output 412.

Figures 4B, 4C:
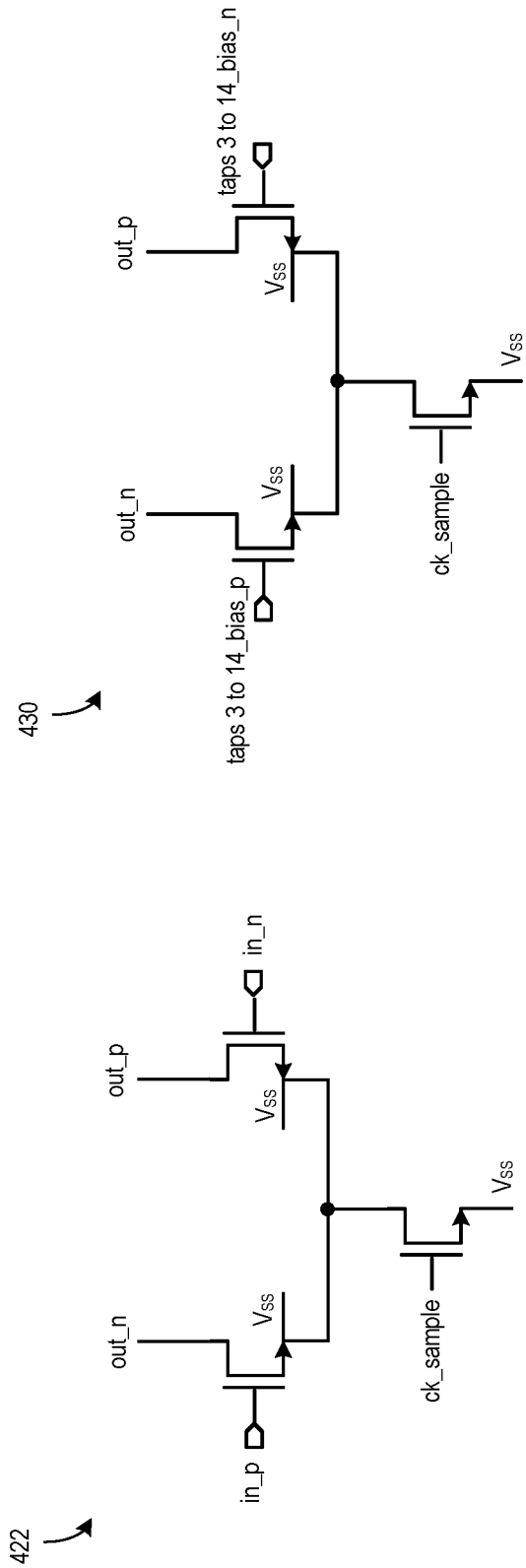
FIG. 4B illustrates an exemplary main-input circuit, according to one embodiment.
FIG. 4C illustrates an exemplary summation pre-buffer circuit, according to one embodiment.

FIG. 4B illustrates an exemplary main-input circuit, according to one embodiment. Main-input circuit 422 can output an amplified main data differential input signal to the resolver (e.g., with its out_p and out_n nodes respectively coupled to the corresponding out_p and out_n nodes of the resolver). Main-input circuit 422 is controlled by a sampling clock signal, ck_sample, generated by the pulse generator. The waveform of the sampling clock signal is shown in FIG. 3B. When ck_sample is high, main-input circuit 422 amplifies an input differential data signal (in_p and in_n). A low ck_sample resets main-input circuit 422. In the example shown in FIG. 4B, main-input circuit 422 can include a differential amplifier that includes three FETs (e.g., N-FETs).

Differential-amplifier circuits similar to the one shown in FIG. 4B can also be used to generate an offset-voltage input and a calibration-voltage input. Different offset-voltage inputs can be used by different resolvers sampling different eyes (i.e., using different thresholds) of the PAM4 signal. The calibration-voltage input can be used to calibrate the process variations existing in the different FETs in the main resolver.

FIG. 4C illustrates an exemplary summation pre-buffer circuit, according to one embodiment. Summation pre-buffer circuit 430 can be similar to main-input circuit 422. Like main-input circuit 422, summation pre-buffer circuit 430 can include a differential amplifier comprising three FETs (e.g., N-FETs). The input signals to summation pre-buffer circuit 430 can include the differential bias voltages (e.g., which represent weights) for a plurality of taps (e.g., taps 3 to 14), including both the positive bias and the negative bias.

Figure 4D:
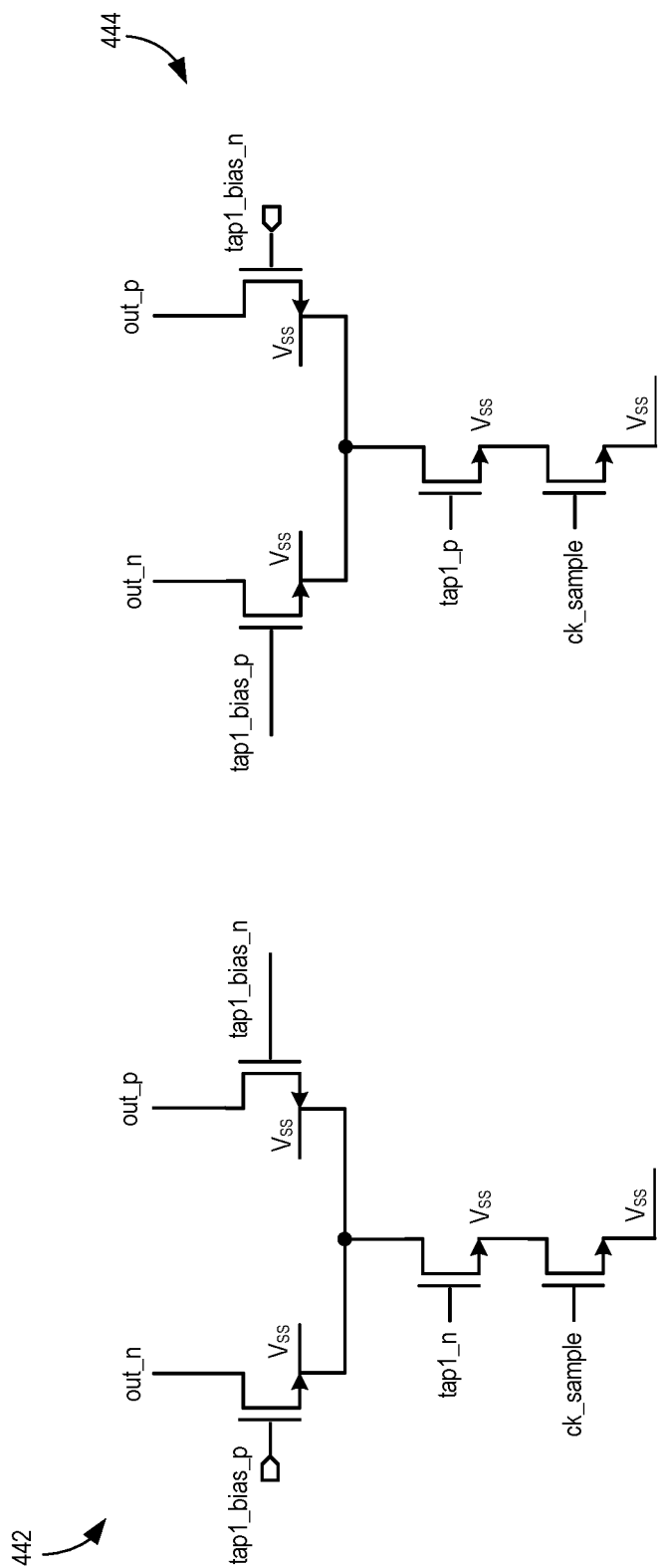
FIG. 4D illustrates an exemplary tap-1 feedback circuit, according to one embodiment.

FIG. 4D illustrates an exemplary tap-1 feedback circuit, according to one embodiment. More specifically, tap-1 feedback circuit 440 can include two differential amplifiers (e.g., amplifiers 442 and 444) that are coupled to each other in parallel, forming a sign-unrolled tap-1 feedback structure. More specifically, inputs to both differential amplifiers 442 and 444 can be the positive and negative bias voltages (which represent the weight factor) for tap-1.

Moreover, only one of differential amplifiers 442 and 444 will be turned on, depending on the sign of the tap-1 feedback. Including both amplifiers in the tap-1 feedback circuit allows the tap-1 feedback circuit to handle both positive and negative feedbacks. In other words, the positive and negative-side decision feedback signals are separately sent to the two parallel differential amplifiers (e.g., amplifiers 442 and 444).

Note that, compared to the loop-unrolled solution, the tap-1 feedback is directly added to the input signal at the comparator, because output currents from the various differential amplifiers are summed at the main resolver (e.g., by summing the currents), as shown in FIG. 2B and FIG. 4A. There is no need to include a multiplexer to select a positive or negative feedback.

In the PAM4 application where there are three parallel samplers for sampling the input signal against three threshold values (e.g., as shown in FIG. 1), there will be three duplicated tap-1 feedback circuits, each controlled by the decision output from a particular sampler. For simplicity of illustration, the duplicated tap-1 feedback circuits are not shown in FIG. 4D. In practice, all six differential amplifiers are coupled to each other in parallel and their outputs are summed at the main resolver.

Figure 5A:
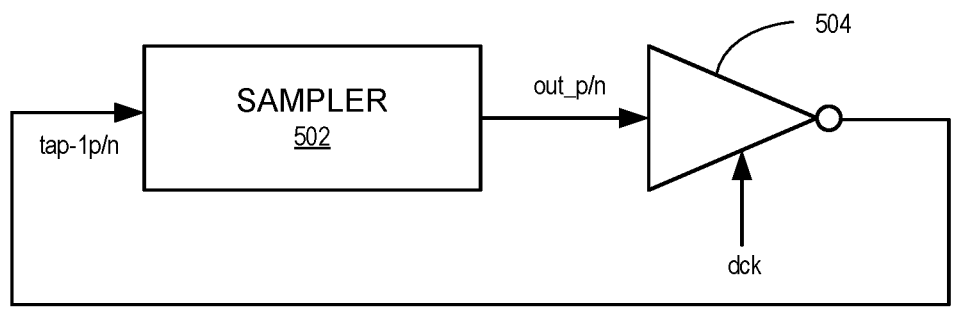
FIG. 5A illustrates the block diagram of the comparator and inverter, according to one embodiments.

The differential decision outputs (e.g., out_p and out_n) from the comparator circuit can be sent to an inverter circuit, and the inverter output can be used as inputs to the tap-1 feedback circuits. FIG. 5A illustrates the block diagram of the comparator and inverter, according to one embodiment. In FIG. 5A, the differential output of comparator 502 is sent to inverter 504, which is controlled by a clock signal (e.g., dck). The clock signal can be the same clock signal controlling the operation of the main resolver in comparator 502. In some embodiments, inverter 504 can be a tri-state inverter. More specifically, when the clock signal is low, the output of inverter 504 can be disconnected or in the high-impedance state. The differential output of inverter 504 is sent back to comparator 502 as feedback signals, which can be summed with the other input signals (e.g., the main input signal, the threshold (e.g., voffset) signal, the calibration signal, feedback signals from other taps, etc. Note that, for simplicity of illustration, FIG. 5A does not show feedback circuit for other taps, which can typically include different stages of time delays.

Figure 5B:
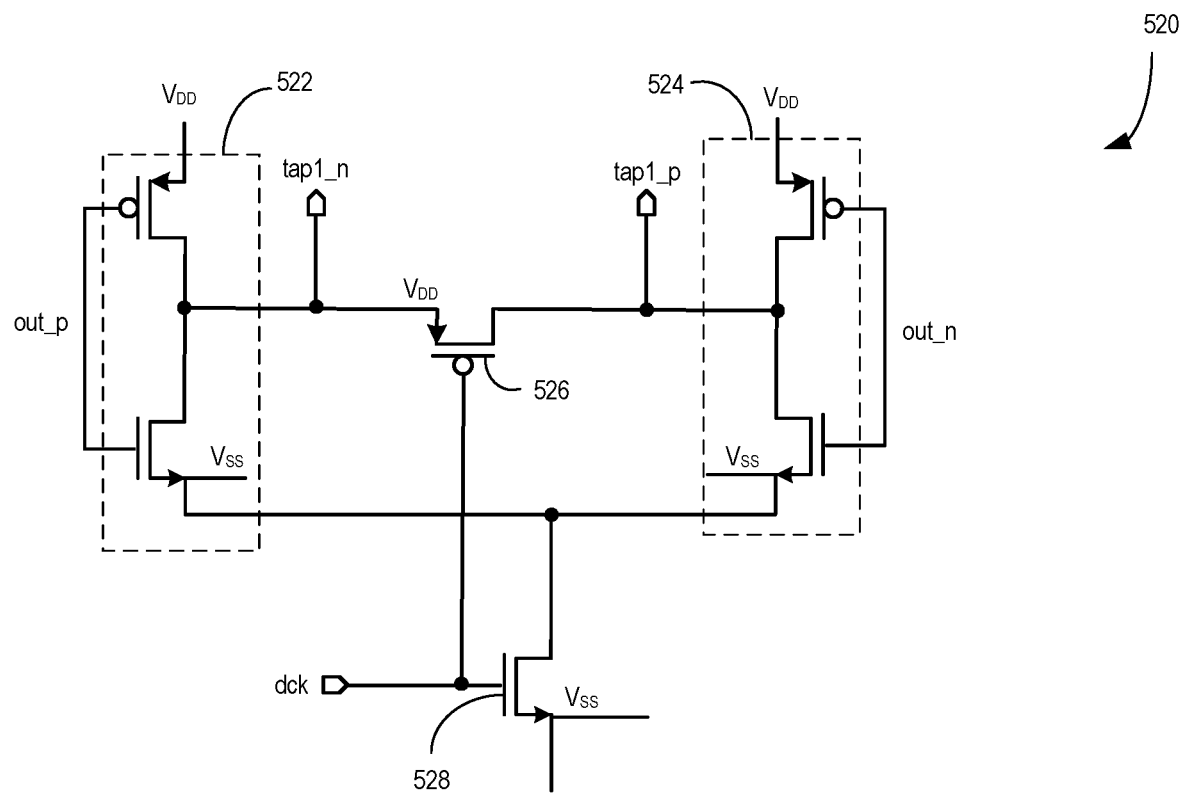
FIG. 5B illustrates an exemplary tri-state inverter circuit, according to one embodiment.

FIG. 5B illustrates an exemplary tri-state inverter circuit, according to one embodiment. Tri-state inverter 520 can include two pairs of inverters (e.g., inverters 522 and 524), with their outputs coupled to each other via a transistor (e.g., a PFET) 526. Moreover, another transistor (e.g., an NFET) 528 can be coupled to inverters 522 and 524, and can be used to enable or disable the inverters under the control of a clock signal. More specifically, when the clock signal is low, outputs of the inverters can be in the high-impedance state. In some embodiments, tri-state inverter 520 can be precharged, with out_p and out_n nodes both pulled to a high voltage level (e.g., $V_{DD}$). Consequently, its outputs (e.g., tap1_p/n) will be roughly about half of the high voltage level (i.e., $\frac{1}{2}V_{DD}$). This arrangement can increase the gain, and hence, the speed of tri-state inverter 520. Moreover, the increased gain of tri-state inverter 520 can also increase the input sensitivity of the feedback circuit.

Figure 6:
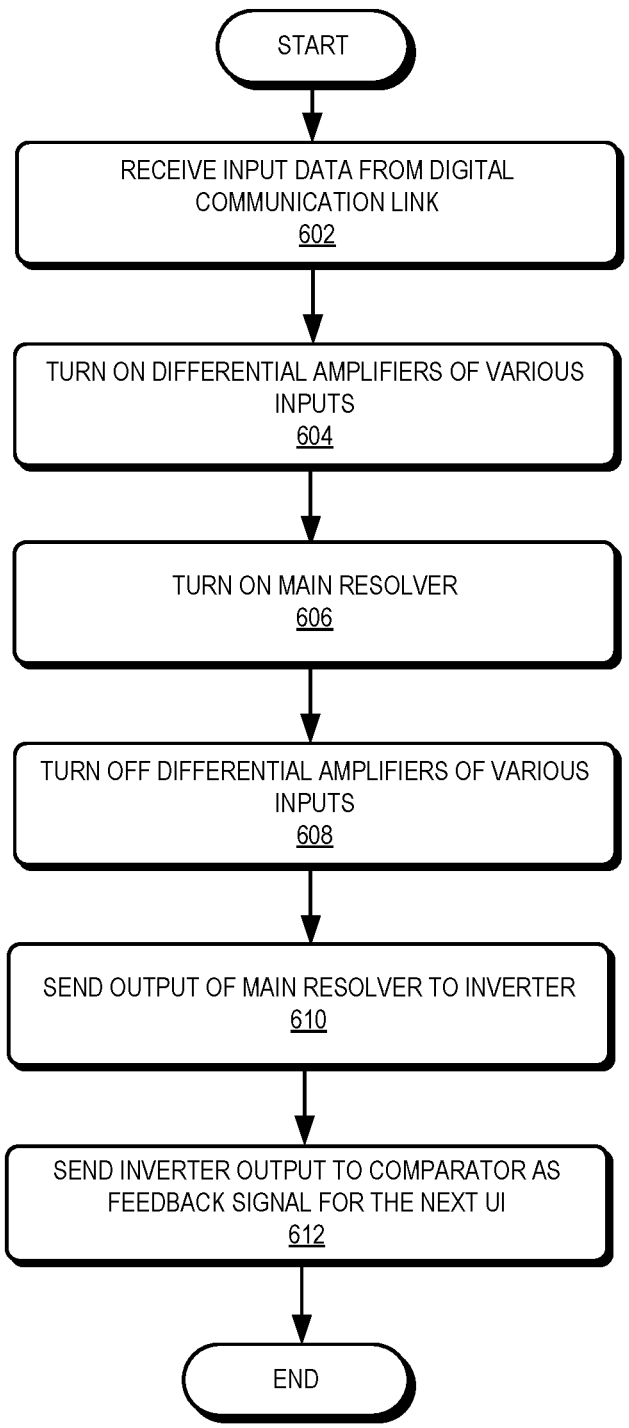
FIG. 6 presents a flowchart illustrating an exemplary operation process of the DFE, according to one embodiment.

FIG. 6 presents a flowchart illustrating an exemplary operation process of the DFE, according to one embodiment. During operation, the comparator circuit of the DFE receives input data from a digital communication link (operation 602). In some embodiments, the DFE can operate at the half clock rate of the input data. In such a scenario, the DFE can include two branches (e.g., an odd branch and an even branch), and at operation 602, one of the two branches receives the input data. The input data can be a differential data that include a positive input and a negative input. Moreover, the input data can be encoded in PAM4 format. In addition to the input data from the digital link, the comparator circuit can receive other input signals, including threshold voltages, calibration voltages, and feedback signals of multiple taps. Note that the feedback signals are generated based on the decision output of the comparator circuit of a previous UI. Note that the various input signals are sent to corresponding differential amplifiers and will be converted to currents that can influence the output of the main resolver of the comparator.

At a predetermined instant, the various differential amplifiers of inputs are turned on (operation 604). The output currents of these amplifiers may need time to settle, during which the main resolver circuit remains off. After a predetermined time interval, the main resolver is turned on to sample the various input signals, including the input data from the digital link, the threshold voltages, calibration voltages, and feedback signals of multiple taps (e.g., taps 1 to 14) (operation 606). More specifically, to meet the tight timing requirement, the tap-1 feedback signal can be generated by a circuit having a sign-unrolled structure, which has two identical differential amplifiers coupled to each other in parallel. The inputs to the differential amplifiers can be the differential bias voltage for the tap-1, which corresponds to the weight factor for the tap-1 feedback signal. The "on" or "off" state of these two differential amplifiers can be controlled by the decision output of the sampler circuit of the previous UI. More specifically, the positive and negative outputs of the sampler of the previous UI can be separately sent to the two differential amplifiers. For a PAM4 encoded link that requires three samplers to output three sampling outputs, the sign-unrolled tap-1 feedback circuit can include six differential amplifiers that are coupled to each other in parallel.

Note that these various inputs can be summed (e.g., in the form of current summation) at the main resolver, and the summation outcome will determine the resolver output.

While the resolver is on, the various differential amplifiers are turned off (operation 608). This creates a narrow sampling window (e.g., less than 1 ps) for the main resolver. Once the differential amplifiers are off, any fluctuations from the various input signals will not affect the decision output of the main resolver.

Subsequent to sampling all input signals, the resolver output, which is also the decision output of the comparator circuit, can be sent to the tri-state inverter (operation 610). The tri-state inverter inverts the resolver output and sends the inverted signal back to the comparator as the tap-1 feedback signal for the next UI (operation 612). Note that feedback signals for additional taps may be achieved by applying different stages of time delay to the decision output of the comparator circuit.

In general, the disclosed embodiments provide a half-rate, direct feedback DFE. The fast speed and simplicity in structure of the various circuit components within the DFE make it possible for the DFE to be implemented in a high-speed digital link encoded with PAM4. When concentrating on the tap-1 feedback circuit (because timings are relaxed for later taps), the main components of the DFE can include a comparator circuit and a tri-state inverter. The comparator circuit can further include a main resolver and multiple parallelly coupled differential amplifiers coupled to the output nodes of the main resolver. Because these differential amplifiers are coupled to each other in parallel, the various input signals, including the data input, the sampling threshold voltage, the calibration voltage, and the feedback voltages, are essentially summed (e.g., in the form of current summation) at the output nodes of the main resolver to influence the decision output of the main resolver. To ensure that timing constraints can be met, the circuit configured to generate the tap-1 feedback can be sign-unrolled by including two duplicate amplifiers coupled to each other in parallel. Depending on the sign of the detected symbol of a previous UI, only one of the two differential amplifiers can be turned on. This sign-unrolled structure is faster than the conventional loop-unrolled structure, because there is no need for a multiplier. To increase the speed of the main resolver, the outputs of the main resolver can be pre-charged. To ensure stability and accuracy of the sampling output, the main resolver can be configured to sample the various input signals within a narrow window created by two clock signals with an offset. To further reduce delay and increase gain, the resolver output can be sent to a tri-state inverter and the inverted signal can be sent back to the comparator circuit as feedback signals for the next UI.

In some embodiments, the various circuits shown in FIGS. 3A and 4A-5B can be implemented using various technologies for fabricating field-effect transistors (FETs), such as the 16-nm transistor fabrication technology. The scope of the disclosure is not limited to the type and size of the transistors.

One embodiment can provide a sampler for a decision feedback equalizer (DFE). The sampler can include a comparator comprising a resolver and a plurality of amplifiers coupled to the resolver. The plurality of amplifiers are to receive an input signal and one or more feedback signals, and the plurality of amplifiers are coupled to each other in parallel, thereby facilitating a summation of the input signal and the one or more feedback signals. The comparator is to generate an output based on the summation of the input signals and the one or more feedback signals. The sampler can further include an inverter to invert the output of the comparator. The inverted output of the inverter is sent to a tap-1 amplifier to generate a tap-1 feedback signal to be sent to the comparator at a next unit interval (UI).

In a variation on this embodiment, the tap-1 amplifier can include a sign-unrolled structure comprising two duplicate amplifiers to facilitate generation of both positive and negative feedback signals. In this disclosure, the word "facilitate" can include the meaning of "making possible," "enabling," "providing the necessary functions and/or steps," "being part of," etc.

In a further variation, the two duplicated amplifiers are differential amplifiers separately controlled by a positive-side output and a negative-side output of the sampler.

In a variation on this embodiment, the sampler can further include a pulse generator, which generates first and second clock signals of a same rate with a predetermined offset.

In a further variation, the first clock signal controls operations of the resolver and the second clock signal controls operations of the plurality of amplifiers. A rising edge of the first clock signal and a falling edge of the second clock signal form a narrow sampling window to allow the resolver to sample the input signal and the one or more feedback signals.

In a further variation, the rate of the first and second clock signals is half of a clock rate associated with the input signal.

In a variation on this embodiment, the input signal is encoded using a 4-level pulse-amplitude-modulation (PAM4) scheme.

In a variation on this embodiment, the resolver can include a pair of cross-coupled inverters, and outputs of the cross-coupled inverters can be pre-charged to a high voltage level, thereby enhancing a response speed of the resolver.

In a variation on this embodiment, the inverter can include a tri-state inverter controlled by a clock signal. While the tri-state inverter is in a high-impedance state, an output of the tri-state inverter is pre-charged, thereby enhancing a response speed of the inverter.

In a variation on this embodiment, the inverter can further include one or more delay circuits to delay the output of the comparator to generate feedback signals of additional taps.

One embodiment can provide a method for generating a tap-1 feedback signal for a decision feedback equalizer. The method can include: receiving, at a resolver from a plurality of coupled amplifiers, an input signal and one or more feedback signals, wherein each of the input signal and the feedback signals is provided to the resolver by a respective amplifier; summing, at the resolver, the input signal and the one or more feedback signals by coupling the plurality of amplifiers in parallel; and generating, by the resolver, an output based on the summed input signal and the one or more feedback signals. The method can further include inverting, by an inverter, the output of the comparator; and sending the inverted output to a tap-1 amplifier to generate a tap-1 feedback signal to be sent to the comparator at a next unit interval (UI).

One embodiment can provide a half-rate decision feedback equalizer (DFE). The DFE can include an odd sampler for sampling odd bits of an input signal and an even sampler for sampling even bits of the input signal. A respective sampler can include a comparator comprising a resolver and a plurality of amplifiers coupled to the resolver. The plurality of amplifiers are to receive an input signal and one or more feedback signals, and the plurality of amplifiers are coupled to each other in parallel, thereby facilitating a summation of the input signal and the one or more feedback signals. The comparator is to generate an output based on the summation of the input signals and the one or more feedback signals. The sampler can further include an inverter to invert the output of the comparator, and the inverted output of the inverter is sent to a tap-1 amplifier to generate a tap-1 feedback signal to be sent to the comparator at a next unit interval (UI).

The foregoing descriptions of embodiments have been presented for purposes of illustration and description only. They are not intended to be exhaustive or to limit the scope of this disclosure to the forms disclosed. Accordingly, many modifications and variations will be apparent to practitioners skilled in the art.

What is claimed is:

1. A sampler for a decision feedback equalizer (DFE), the sampler comprising:
    a comparator comprising a resolver and a plurality of amplifiers coupled to the resolver, wherein the plurality of amplifiers are to receive an input signal and one or more feedback signals, wherein the plurality of amplifiers are coupled to each other in parallel, thereby facilitating a summation of the input signal and the one or more feedback signals, and wherein the comparator is to generate an output based on the summation of the input signals and the one or more feedback signals; and
    an inverter to invert the output of the comparator, wherein the output of the comparator inverted by the inverter is sent to a tap-1 amplifier to generate a tap-1 feedback signal to be sent to the comparator at a next unit interval (UI).

2. The sampler of claim 1, wherein the tap-1 amplifier comprises a sign-unrolled structure comprising two duplicate amplifiers to facilitate generation of both positive and negative feedback signals.

3. The sampler of claim 2, wherein the two duplicated amplifiers are differential amplifiers separately controlled by a positive-side output and a negative-side output of the sampler.

4. The sampler of claim 1, further comprising a pulse generator, wherein the pulse generator generates first and second clock signals of a same rate with a predetermined offset.

5. The sampler of claim 4, wherein the first clock signal controls operations of the resolver and the second clock signal controls operations of the plurality of amplifiers; and wherein a rising edge of the first clock signal and a falling edge of the second clock signal form a narrow sampling window to allow the resolver to sample the input signal and the one or more feedback signals.

6. The sampler of claim 4, wherein the rate of the first and second clock signals is half of a dock rate associated with the input signal.

7. The sampler of claim 1, wherein the input signal is encoded using a 4-level pulse-amplitude-modulation (PAM4) scheme.

8. The sampler of claim 1, wherein the resolver comprises a pair of cross-coupled inverters, and wherein outputs of the cross-coupled inverters can be pre-charged to a high voltage level, thereby enhancing a response speed of the resolver.

9. The sampler of claim 1, wherein the inverter comprises a tri-state inverter controlled by a clock signal, and wherein, while the tri-state inverter is in a high-impedance state, an output of the tri-state inverter is pre-charged, thereby enhancing a response speed of the inverter.

10. The sampler of claim 1, further comprising one or more delay circuits to delay the output of the comparator to generate feedback signals of additional taps.

11. A method for generating a tap-1 feedback signal for a decision feedback equalizer (DFE), the method comprising:
    receiving, at a resolver from a plurality of coupled amplifiers, an input signal and one or more feedback signals, wherein each of the input signal and the feedback signals is provided to the resolver by a respective amplifier;
    summing, at the resolver, the input signal and the one or more feedback signals by coupling the plurality of amplifiers in parallel;
    generating, by the resolver, an output based on the input signal and the one or more feedback signals summed at the resolver;
    inverting, by an inverter, the output of the comparator; and
    sending the output of the comparator inverted by the inverter to a tap-1 amplifier to generate a tap-1 feedback signal to be sent to the comparator at a next unit interval (UI).

12. The method of claim 11, wherein the tap-1 amplifier comprises a sign-unrolled structure comprising two duplicate amplifiers, and wherein generating the tap-1 feedback signal comprises generating a positive or a negative tap-1 feedback signal.

13. The method of claim 12, wherein the two duplicated amplifiers are differential amplifiers, and wherein sending the inverted output to the tap-1 amplifier comprises using a positive-side output and a negative-side output of the sampler to separately control the two duplicated amplifiers.

14. The method of claim 11, comprising:
    generating first and second clock signals of a same rate with a predetermined offset.

15. The method of claim 14, comprising:
    controlling operations of the resolver using the first clock signal;
    controlling operations of the plurality of amplifiers using the second clock signal; and
    sampling, by the resolver, the input signal and the one or more feedback signals within a narrow sampling window formed by a rising edge of the first clock signal and a falling edge of the second clock signal.

16. The method of claim 11, wherein the resolver comprises a pair of cross-coupled inverters; and
    wherein the method comprises pre-charging outputs of the cross-coupled inverters to a high voltage level, thereby enhancing a response speed of the resolver.

17. The method of claim 11, wherein the inverter comprises a tri-state inverter controlled by a clock signal; and
    wherein the method comprises pre-charging an output of the tri-state inverter while the tri-state inverter is in a high-impedance state, thereby enhancing a response speed of the inverter.

18. The method of claim 11, further comprising delaying the output of the comparator for one or more UIs to generate feedback signals of additional taps.

19. A half-rate decision feedback equalizer (DFE), comprising:
    an odd sampler for sampling odd bits of an input signal; and
    an even sampler for sampling even bits of the input signal;
    wherein a respective sampler comprises:
    a comparator comprising a resolver and a plurality of amplifiers coupled to the resolver, wherein the plurality of amplifiers are to receive the input signal and one or more feedback signals, wherein the plurality of amplifiers are coupled to each other in parallel, thereby facilitating a summation of the input signal and the one or more feedback signals, and wherein the comparator is to generate an output based on the summation of the input signals and the one or more feedback signals; and an inverter to invert the output of the comparator, wherein the output of the comparator inverted by the inverter is sent to a tap-1 amplifier to generate a tap-1 feedback signal to be sent to the comparator at a next unit interval (UI).

20. The half-rate DFE of claim 19, wherein the tap-1 amplifier comprises a sign-unrolled structure comprising two duplicate amplifiers to facilitate generation of both positive and negative feedback signals.

\* \* \* \* \*